(12) United States Patent
Heitbrink et al.

(10) Patent No.: US 12,460,881 B2
(45) Date of Patent: Nov. 4, 2025

(54) COOLING COMPONENT AND METHOD FOR PRODUCING THE SAME

(71) Applicant: ERWIN QUARDER SYSTEMTECHNIK GMBH, Espelkamp (DE)

(72) Inventors: Alexander Heitbrink, Stemwede (DE); Georg Siewert, Pohlheim (DE)

(73) Assignee: ERWIN QUARDER SYSTEMTECHNIK GMBH, Espelkamp (DE)

( * ) Notice: Subject to any disclaimer, the term of this patent is extended or adjusted under 35 U.S.C. 154(b) by 153 days.

(21) Appl. No.: 18/222,251

(22) Filed: Jul. 14, 2023

(65) Prior Publication Data

US 2024/0019219 A1    Jan. 18, 2024

(30) Foreign Application Priority Data

Jul. 18, 2022   (DE) ...................... 10 2022 117 863.3
Jun. 9, 2023    (DE) ...................... 10 2023 115 116.9

(51) Int. Cl.
| | |
|---|---|
| *F28F 9/06* | (2006.01) |
| *F28F 3/12* | (2006.01) |
| *F28F 9/22* | (2006.01) |

(52) U.S. Cl.
CPC ................. *F28F 9/06* (2013.01); *F28F 3/12* (2013.01); *F28F 2009/222* (2013.01); *F28F 2260/00* (2013.01)

(58) Field of Classification Search
CPC .... F28F 9/06; F28F 9/26; F28F 9/0265; F28F 9/0221; F28F 3/12; F28F 2260/00;
(Continued)

(56) References Cited

U.S. PATENT DOCUMENTS 10,208,879 B2 *  2/2019  Hunt ...................... F28F 21/084
11,417,922 B2 *  8/2022  Schmitt ............. H01M 10/6556
(Continued)

FOREIGN PATENT DOCUMENTS

CN    105932353 A  *  9/2016  .......... H01M 10/613
DE    102012217870 A1 *  4/2014  .......... H01M 10/625
(Continued)

*Primary Examiner* — Bayan Salone
(74) *Attorney, Agent, or Firm* — Oliff PLC

(57) ABSTRACT

A cooling component and method for producing a cooling component, having an elongated cooling body made of metal or metal alloy, with which an object may be cooled, wherein the cooling body has one or more medium channels for the throughflow of cooling medium, and having a connection part, which is connected to the cooling body in a fluid-tight manner and via which the cooling medium can be supplied to the cooling body and/or via which the cooling medium can be discharged from the cooling body. The connection part is made from plastic to connect the connection part to the cooling body, a first, which has a plurality of cooling faces, each with three-dimensional nanostructures and/or microstructures incorporated by physical and/or chemical nanostructuring or microstructuring methods, is incorporated in the receiving space of a receptacle of the connection part and is connected to the receptacle there in a fluid-tight manner.

7 Claims, 6 Drawing Sheets

Figure 1:
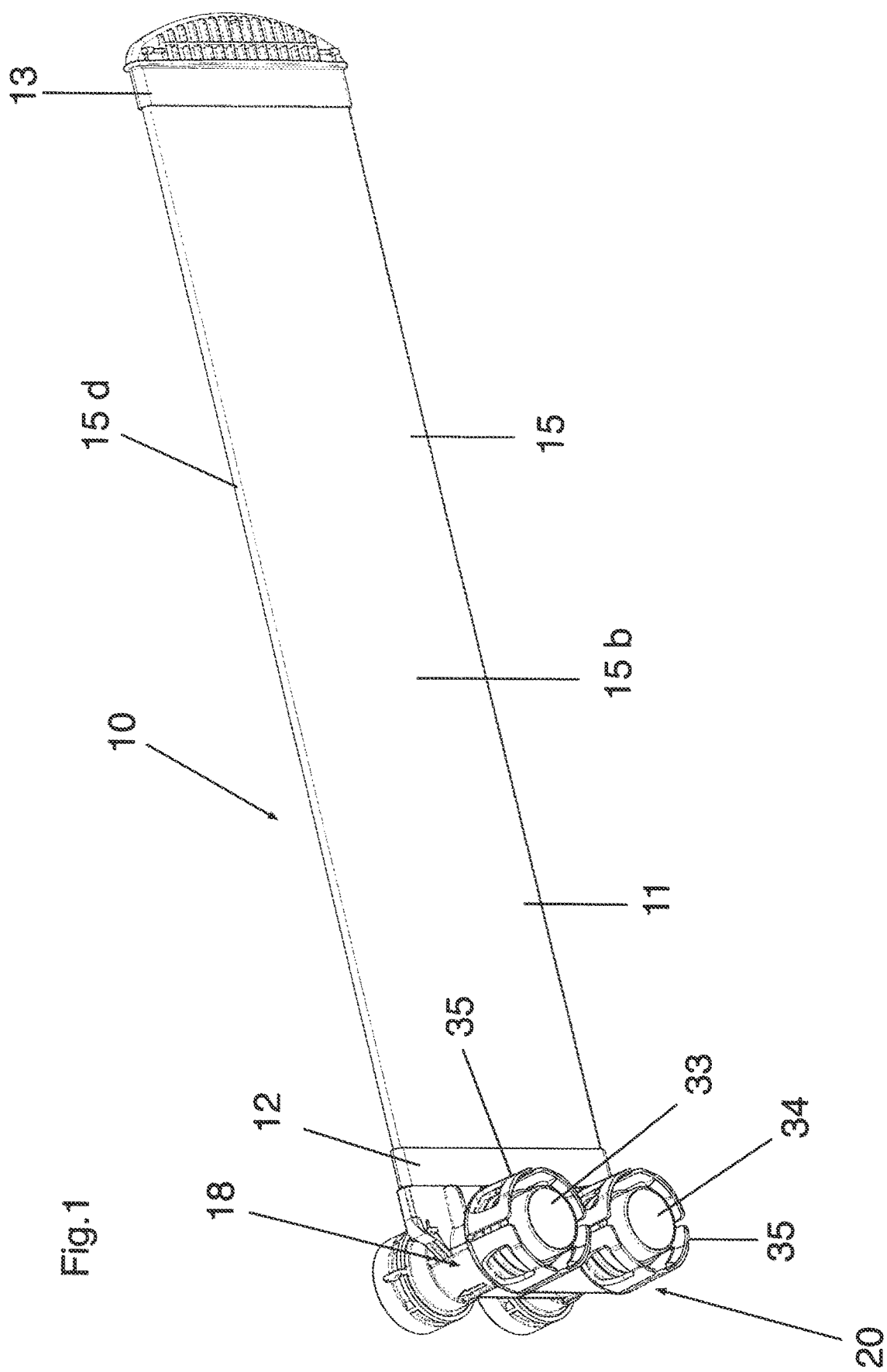

(58) Field of Classification Search
CPC ............. F28F 2009/222; F28F 2230/00; F28F 2275/08; F28F 21/06; F28F 21/08; H05K 7/20263; H05K 7/20272; H01L 23/473; H01M 10/613; H01M 10/625; H01M 10/653; H01M 10/6556; H01M 10/6567
See application file for complete search history.

(56) References Cited

U.S. PATENT DOCUMENTS

| | | | |
|---|---|---|---|
| 11,940,230 B2 * | 3/2024 | Thomsen | F28F 9/14 |
| 12,017,500 B2 * | 6/2024 | Kim | H05K 7/20272 |
| 2014/0090812 A1 * | 4/2014 | Schmid | F28F 9/162 |
| | | | 165/104.19 |
| 2017/0343144 A1 * | 11/2017 | Hunt | F16L 37/133 |
| 2020/0106145 A1 * | 4/2020 | Schmitt | H01M 10/6556 |
| 2022/0065555 A1 * | 3/2022 | Thomsen | F28F 9/165 |
| 2022/0097477 A1 * | 3/2022 | Kim | H01L 23/473 |

FOREIGN PATENT DOCUMENTS

| | | | | |
|---|---|---|---|---|
| DE | 102016125859 A1 * | 7/2017 | ............ | F28F 9/0221 |
| DE | 102017210343 A1 * | 12/2018 | .......... | H01M 50/141 |
| DE | 102018216720 A1 | 4/2020 | | |
| EP | 3885689 A1 * | 9/2021 | ................ | F28F 9/06 |
| JP | 2016161158 A * | 9/2016 | ........ | H01M 10/6567 |
| WO | WO-2016004528 A1 * | 1/2016 | ............... | G06F 1/20 |
| WO | WO-2021190913 A1 * | 9/2021 | ................ | F28F 9/06 |

* cited by examiner

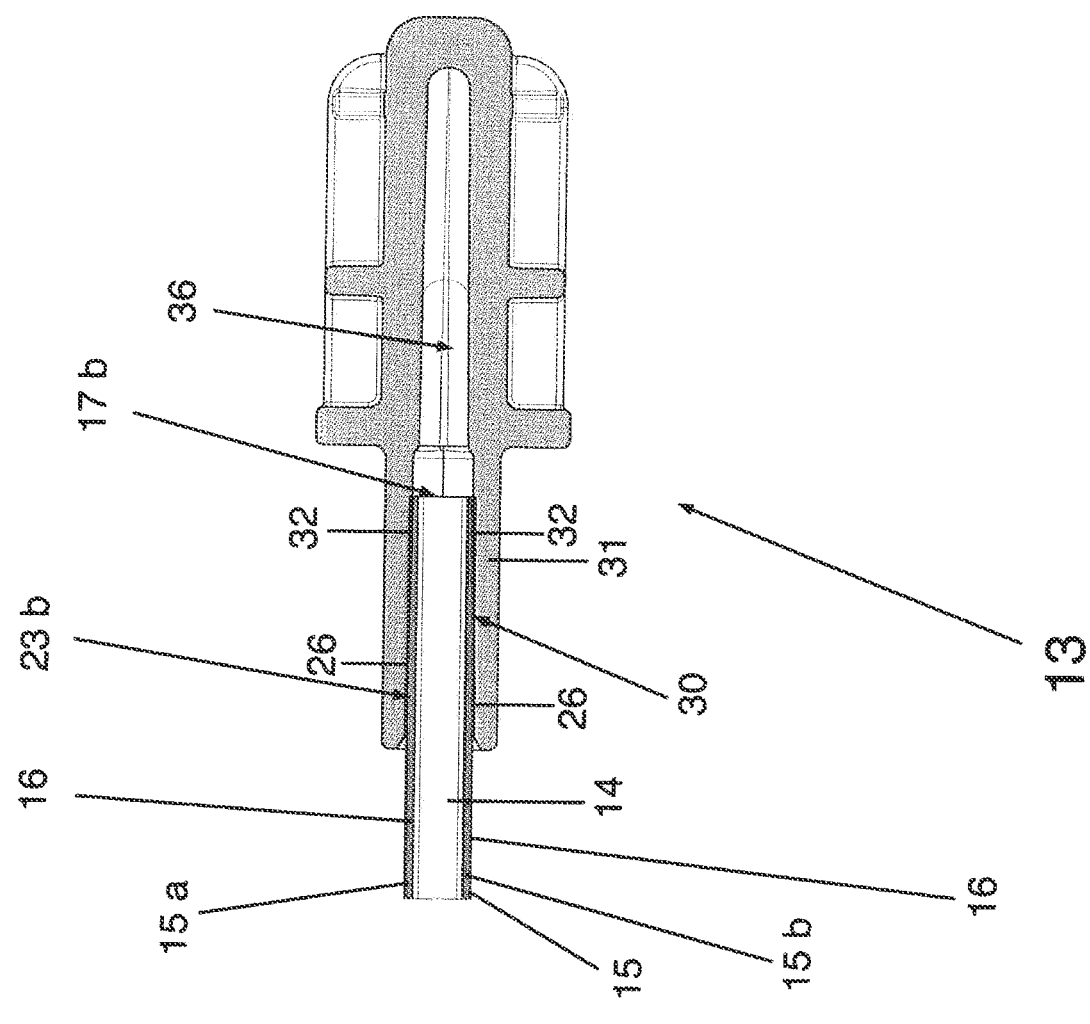

COOLING COMPONENT AND METHOD FOR PRODUCING THE SAME

The present invention relates to a cooling component having an, in particular, elongated, preferably coated, cooling body made of metal or a metal alloy, in particular aluminum, with which an object may be cooled; wherein the cooling body has one or more, preferably parallel, in particular elongated and/or linear medium channels for the throughflow of cooling medium, and having a connection part, which is connected to the cooling body in a fluid-tight manner and via which the cooling medium can be supplied to the cooling body and/or via which the cooling medium can be discharged from the cooling body. The invention furthermore relates to a method for producing such a cooling component.

Cooling components for dissipating heat from objects to be cooled are also referred to as heat exchangers and are used in many areas of technology. Such cooling components are particularly important, amongst other things, for cooling battery or accumulator systems for electric vehicles, but also power electronic components, busbars or processor chips. The cooling components mentioned at the outset are generally part of a superordinate cooling device, which ensures that cooling medium, for instance water or the like, is continuously guided through the cooling component.

The cooling bodies, which, during operation, generally abut against the object to be cooled, or are at least arranged in the immediate vicinity thereof, are frequently produced from individual components made of metal or a metal alloy (e.g. steel) by welding or soldering these components together in a time-consuming manner. The connection part, connected to the cooling body, for supplying and/or discharging cooling medium is frequently made from the same metal or the same metal alloy as the cooling body and is likewise welded or soldered thereto in a time-consuming manner. However, since such connection parts are generally not intended for the direct heat transfer from the object to be cooled to the cooling component, there is actually no need to also produce the connection parts from a highly heat-conductive, metallic material. In functional terms, this may even be counter-productive.

The object of the present invention is to further develop the cooling component mentioned at the outset and to specify a method for producing such a further developed cooling component.

This object is achieved by a cooling component and a production method.

A cooling component according to the invention is accordingly characterized in that the connection part is made from plastic (preferably formed as a plastic injection molded part), wherein, to connect the connection part to the cooling body, which is preferably produced or made from aluminum, a first, in particular terminal, connecting region of the cooling body, which has a plurality of connecting faces, each with three-dimensional nanostructures and/or microstructures incorporated, in particular, by physical and/or chemical nanostructuring or microstructuring methods, is incorporated in the receiving space of a receptacle of the connection part and is connected to the receptacle there in a fluid-tight manner. The connecting region of the cooling body here is connected to the receptacle in a fluid-tight manner in that each connecting face of the cooling body is opposite a respectively associated connecting face of the receptacle and is pressed together with this (with direct thermal joining).

According to the invention, the method mentioned at the outset for producing such a cooling component comprises the following measures:

a) inserting a or the, in particular, terminal connecting region of a/the prefabricated cooling body, which is, in particular, produced by profile extrusion and, in particular, manufactured in one piece or formed in one piece, into the receiving space of a receptacle of a/the prefabricated, in particular injection molded, plastic connection part for the cooling body via a relative movement between the cooling body and the connection part, so that each of a plurality of, in particular mutually parallel opposing connecting faces of the connecting region of the cooling body, each with three-dimensional nanostructures and/or microstructures incorporated, in particular, by physical and/or chemical nanostructuring or microstructuring methods, is opposite a respectively associated connecting face of the receptacle of the connection part, in particular a respectively associated connecting face which is arranged on an inner side of a wall of the receptacle, b) heating the connecting faces of the cooling body, in particular via induction, to a temperature which corresponds at least to the melting temperature of the plastic of the connection part, in particular before the connecting region of the cooling body is inserted into the receiving space of the receptacle and/or while the connecting region is located in the receiving space, c) connecting all heated connecting faces of the cooling body to the respectively opposing connecting face of the connection part in a fluid-tight manner by pressing these mutually opposing connecting faces together with fusion of the connecting face of the connection part through the heat of the connecting face of the cooling body.

On the one hand, the use, according to the invention, of a connection part made of plastic is considerably more cost-effective than the use of a connection part made of metal or metal alloys and, on the other, the comparatively low heat conductivity of plastic may be functionally advantageous in this regard in order to prevent unwanted heat transfer to the cooling medium in the region of the connection part, for example.

Since, according to the invention, the plastic part has a receptacle having a receiving space for the cooling body or for a connecting region thereof, a stable and fluid-tight connection between the metallic cooling body—for the sake of simplicity, "metallic" within the context of the application includes both metals and metal alloys—and the connection part made of plastic may be created by the direct thermal joining using the nanostructures and microstructures as part of an advantageous, in particular positionally accurate production process.

The cooling body may advantageously be an elongated, in particular extruded, preferably cuboidal, profile body, preferably realized or produced in one piece, with a plurality of profile body walls which form its outer sides or outer walls. This may be a so-called pocket profile body, for example.

With regard to these outer cooling body walls, a large-surface first wall may be provided and a large-surface second wall, which is spaced from the first wall and extends, in particular, parallel to the first large-surface wall. Moreover, two mutually spaced narrow side walls connecting the first large-surface wall and the second large-surface wall to one another in each case may be provided.

One, more or all of these cooling body outer walls may have a planar (or non-curved), bent (or curved) or wavy design.

The use of one or more of such curved or wavy cooling body outer walls may, for example, improve, or simply enable, the contact with objects to be cooled that likewise have curved outer walls, such as contact with so-called battery cells or round accumulator cells.

The cooling body made of metal, in particular one, more or each cooling body outer wall thereof, may furthermore be entirely or partially coated on one, more or all outer sides, in particular (possibly each) with an electrically insulating insulation layer. This is to prevent short circuits, for example, when the cooling body is placed against an object to be cooled that is not electrically insulated. This or the respective electrically insulating insulation layer may be, for example, a suitable coating layer, a foil layer, a powder coating layer or the like.

With regard to the connecting faces of the cooling body, these may form (terminal) regions of the outer sides of these profile body walls or be arranged in (terminal) regions of these outer sides.

The receptacle of the connection part moreover expediently has receptacle walls, which delimit the receiving space and on the inner sides of which the connecting faces of the connection part or of the receptacle are arranged or whereof the inner sides form the connecting faces of the receptacle.

In a further configuration of the invention, the connection part may have an inlet chamber with an inlet opening for supplying cooling medium to the cooling component.

Provision may preferably further be made for openings or open ends or open sides (in particular open transverse sides) of the medium channels of a first group of medium channels to lead into the inlet chamber or be arranged therein, via which cooling medium may be conducted to this first group of medium channels, which cooling medium can be supplied to the cooling component via the inlet opening and the inlet chamber.

In a further configuration of the invention, the connection part may furthermore have an outlet chamber with an outlet opening for discharging cooling medium from the cooling component, which outlet chamber is, in particular, separate from the inlet chamber.

Provision may be made here for openings or open ends or sides of another) second group of medium channels to lead into the outlet chamber or be arranged therein, via which the cooling medium may flow out of the medium channels of this second group of medium channels and into the outlet chamber and, from there, out of the cooling component via the outlet opening, which second group of medium channels is, in particular, separate from the first group.

Provision may further be made for the first connecting region to be arranged at one end of the cooling body and for a second connecting region of the cooling body, with a plurality of connecting faces, each with three-dimensional nanostructures and/or microstructures incorporated, in particular, by physical and/or chemical nanostructuring or microstructuring methods, to be arranged at a or the second, other end of the cooling body, which second connecting region is incorporated in the receiving space of a receptacle of a deflection cap or in the receiving space of a receptacle of a further connection part made of plastic, via which the cooling medium can be supplied to the cooling body and/or via which the cooling medium can be discharged from the cooling body, and is connected there to the receptacle of the deflection cap or to the receptacle of the further connection part in a fluid-tight manner in that each connecting face of the cooling body is opposite a respectively associated connecting face of the receptacle and is pressed together with this (with direct thermal joining).

In functional terms, the further connection part here may be designed in exactly the same way or a similar way to the (first) connection part described above. It is therefore conceivable that the (first) connection part is arranged at one end of the cooling body, for example, and cooling medium is supplied to the cooling component via this connection part, and the further or second connection part is arranged at the other end, and the cooling medium is then discharged from the cooling component via this connection part. Diverse embodiments are conceivable here.

However, it is furthermore also conceivable that the cooling component has a connection part which has two or more receiving spaces, wherein the cooling component then accordingly also has a plurality of cooling bodies (one for each receiving space), as described in the present application, and whereof one end then has the first connecting region in each case, which is then connected to an associated receiving space in a fluid-tight manner in the way described in the application. The other, second end of the respective cooling body in each case may then have the second connecting region in each case, which, in the way described, is then connected to such a deflection cap in each case and/or to such a further connection part in each case.

The medium channels of the first group and of the second group of media channels here also have open sides or ends or openings in the region of the other end of the cooling body, wherein these open sides/ends or openings are arranged in a deflection space of the deflection cap or lead into this. The deflection cap here is designed in such a way that, in the deflection space, cooling medium which flows, or may flow, into the deflection space from the open sides/ends or openings—arranged in said deflection cap—of the medium channels of the first group of medium channels is deflected to the open sides/ends or openings of the medium channels of the second group of medium channels and may enter these medium channels, then flows through the medium channels of the second group of medium channels and flows further into the outlet chamber via the open sides/ends or openings—arranged in the outlet chamber—of these medium channels.

The or all medium channels may moreover have an elongated and linear design and may be arranged adjacent to one another in the cooling body, extending parallel to the main direction of extent of the cooling body.

Each (elongated) medium channel may preferably be open at two (opposing) transverse sides or ends.

Each (elongated) medium channel may furthermore be delimited at (all) of its longitudinal sides (relative to the main direction of extent of the medium channel) by medium channel walls. This is realized, in particular, by one or two pairs of medium channel walls, which are opposite one another with a spacing, wherein each of the medium channel walls of one of the pairs or of the pair is formed by the first or the second large-surface wall of the cooling component.

In addition, or alternatively, each (elongated) medium channel may furthermore be open at its transverse sides (relative to the main direction of extent of the medium channel), wherein the open transverse sides preferably form those open sides which are arranged in the outlet chamber or in the inlet chamber or in the deflection space.

The medium channel walls of one of the pairs or of the pair, in particular of the other pair, further preferably extend parallel to one another and/or perpendicularly to the first or second large-surface wall.

Adjacent medium channels in each case further preferably share a common medium channel wall of the cooling body along a longitudinal side.

In the two outer medium channels of the medium channels arranged adjacent to one another (in a row), one of the medium channel walls may moreover be formed by one of the narrow side walls of the cooling body.

The medium channels further preferably each extend, in particularly, linearly between the connection part connected to the one terminal connection region on the one hand and the deflection cap connected to the other terminal connecting region of the other.

With the above-described configuration, for example, via the connection part, in particular via the inlet opening or the inlet chamber, cooling medium may be conducted to the medium channels of the first group of medium channels via their open sides/ends or openings arranged in the inlet chamber, which cooling medium then flows through these medium channels, flows out of the other open sides/ends or openings—arranged in the deflection space—of this first group at the other end of the cooling body, and flows into the deflection cap, is then deflected via the open sides/ends or openings—arranged in said deflection cap—of the second group of medium channels into the medium channels of this second group, then flows therein (back) to the connection part, then flows into the outlet chamber from the open sides/ends or openings—arranged in the outlet chamber of the medium channels and is finally discharged from the connection part. On the described path within the cooling body, the cooling medium may absorb the waste heat of a/the object to be cooled (via its outer walls or outer sides) and conducted it away.

The main flow direction of the cooling medium within the inlet chamber may moreover extend at an angle, preferably transversely to the medium channels or to the main direction of extent of the medium channels or to the main flow direction in the medium channels. In particular, to optimize the flow of coolant from the inlet opening to the medium channels, a fluid-conducting wall may then project into the inlet chamber, which fluid-conducting wall is preferably connected to the connection part in one piece, in particular to the receptacle of the connection part, extends at an angle to the main flow direction in the inlet chamber, at least in some regions, (and, in particular, is curved in the direction of the inlet opening, at least in some regions), and conducts/guides the cooling medium flowing along it or meeting it appropriately in the direction of the medium channels.

Alternatively, or in addition, the main flow direction of the cooling medium within the outlet chamber may extend (possibly in each case) at an angle within the outlet chamber, preferably transversely to the medium channels or to the main direction of extent thereof or to the main flow direction within the same, wherein a fluid-conducting wall (possibly also) projects into the outlet chamber, which fluid-conducting wall is, in particular, connected to the connection part in one piece, in particular to the receptacle of the connection part, and extends at an angle to the main flow direction in the outlet chamber, at least in some regions, (and is, in particular, curved in the direction of the outlet opening, at least in some regions) This is likewise realized, in particular, to optimize the flow of the coolant, albeit from the medium channels into the outlet opening.

The inlet opening may preferably be located at one end of the inlet chamber and a connection opening, to which a connection part of an identical or similar further cooling component can be connected, may be located at another end, in particular to connect the inlet opening of the further cooling component to the connection opening.

In addition, or alternatively, provision may be made for the outlet opening to be located at one end of the outlet chamber and for a connection opening, to which a connection part of an identical or similar further cooling component can be connected, to be located at another end, in particular to connect the outlet opening of the further cooling component to the connection opening.

The inlet opening and/or the outlet opening may moreover extend in a plane which extends at an angle, preferably transversely, to the main flow direction within the inlet chamber or to the main direction of extent of the inlet chamber. In addition, and/or alternatively, the outlet opening and/or the connection opening may extend in a plane which extends at an angle, preferably transversely, to the main flow direction within the outlet chamber or to the main direction of extent of the outlet chamber.

In a further configuration of the invention, provision may be made for the cooling component to have connecting means, in particular latching means, for releasably connecting the cooling component to an identical further cooling component.

This is realized, in particular, in such a way that, after such a connection, the connection opening of the inlet chamber of the cooling component is flush with the inlet opening of the inlet chamber of the further cooling component with a fluid-conducting connection between these openings, and/or in such a way that, after such a connection, the connection opening of the outlet chamber of the cooling component is flush with the outlet opening of the outlet chamber of the further cooling component with a fluid-conducting connection between these openings.

With regard to the production method according to the invention, provision may furthermore be made for all connecting faces of the cooling body, or only a pair of (the) connecting faces of the cooling body, which are, in particular, opposite one another at a spacing, to be pressed together with the respectively opposing connecting face of the connection part in that a pressing member presses the respective connecting face of the connection part against the respectively opposing connecting face of the cooling body in each case.

Provision may furthermore generally be made for all connecting faces of the cooling body, or only a pair of, in particular, opposing connecting faces of the cooling body, to be pressed together with the respectively opposing connecting face of the connection part in that the spacing of mutually opposing connecting faces of the cooling body is matched to the spacing of mutually opposing connecting faces of the connection part so that, by heating these connecting faces of the cooling body in the inserted state of the connecting region of the cooling body in the receiving space of the connection part, the thermal expansion of the cooling body material results in a press fit, in the course of which the respective connecting face of the cooling body is pressed against the respectively opposing connecting face of the connection part.

Provision may furthermore be made for those connecting faces of the connection part which are opposite the first large-surface wall or the second large-surface wall of the cooling body in each case to be pressed against the respectively opposing connecting face of the cooling body by a respective pressing member, and/or for those connecting faces of the connection part which are opposite a connecting face of one of the narrow side walls of the cooling body in each case to be connected to the respective connecting face of the cooling body via the press fit.

Provision may furthermore be made for the connecting faces of all of these walls of the cooling body to be connected to the respectively opposing connecting face of the connection part by a respective pressing member pressing the connecting face of the connection part against the respective wall.

Provision may furthermore be made for the pressing of the respective connecting face of the connection part against the respectively opposing connecting face of the cooling body to take place by means of the respective pressing member in that this applies pressure to the wall of the receptacle on which the respective connecting face is arranged, in particular to the outer side of this wall.

Figure 2:
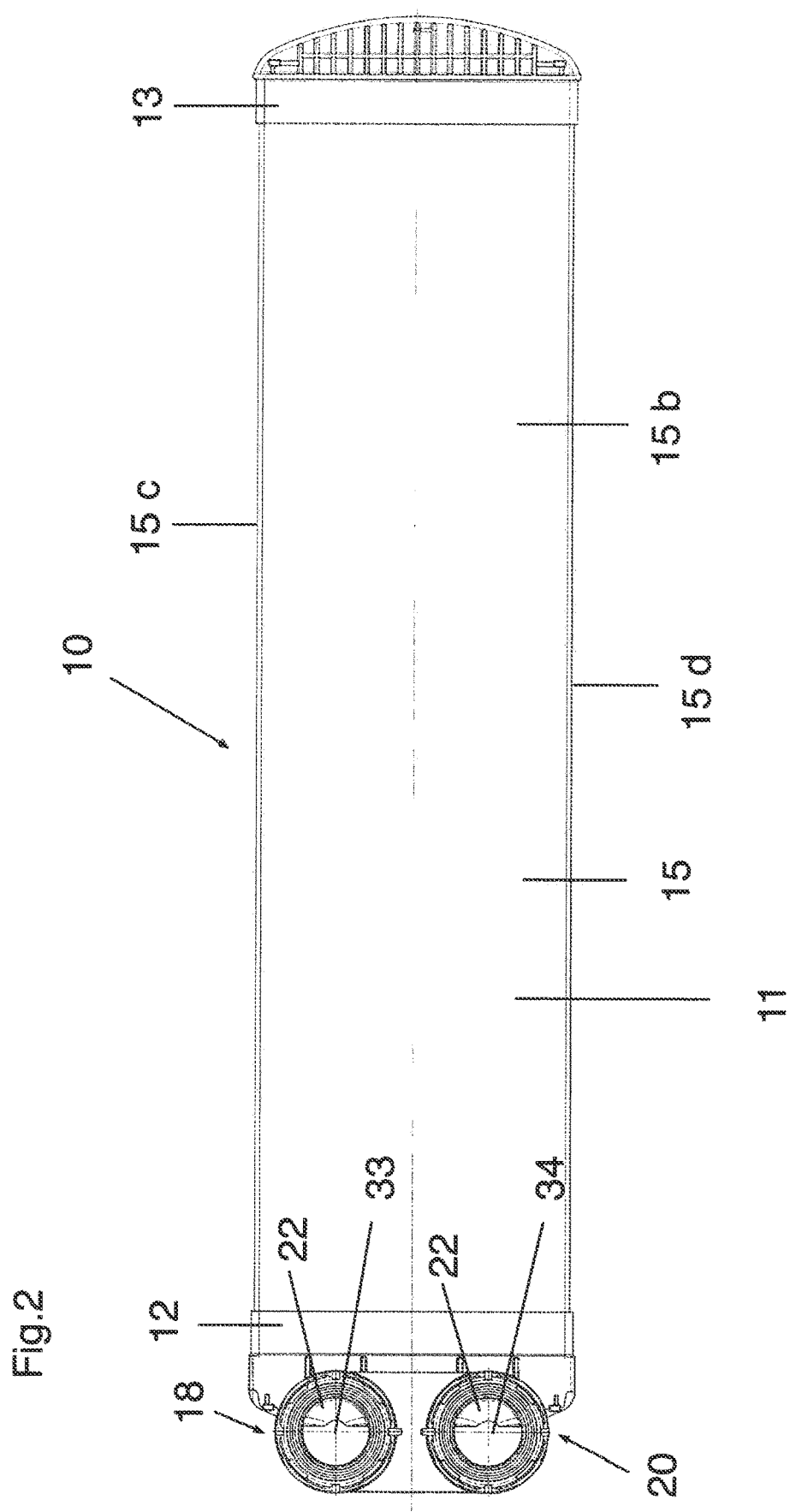
Figure 3:
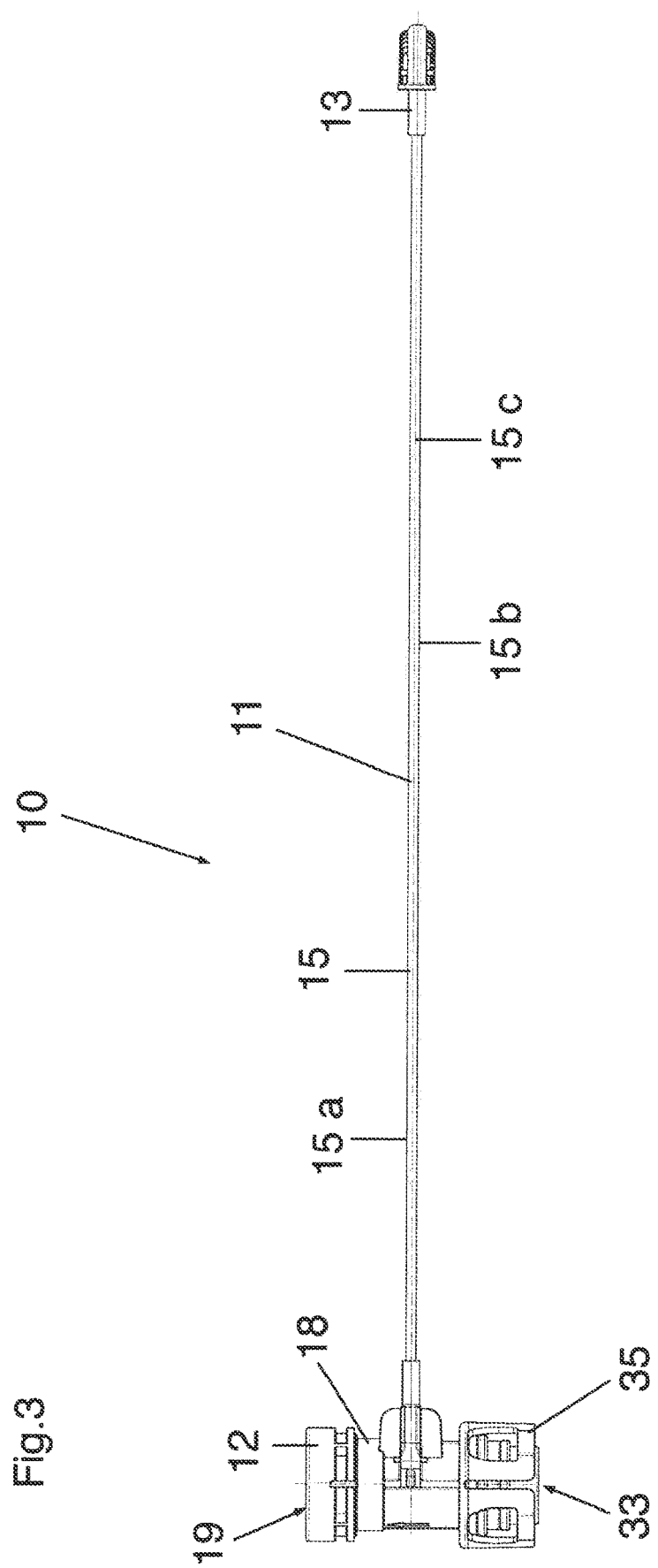
Figure 4:
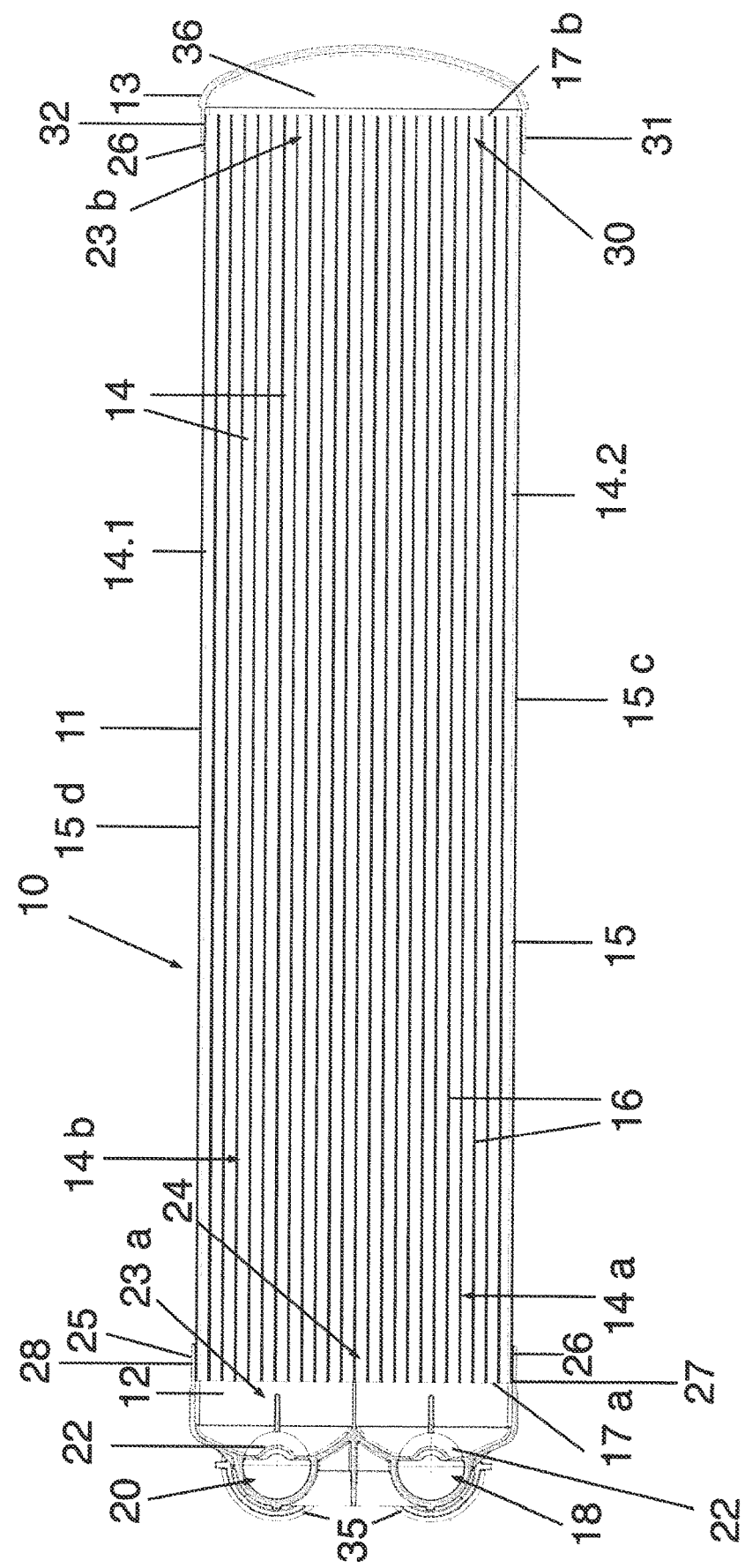
Figure 5:
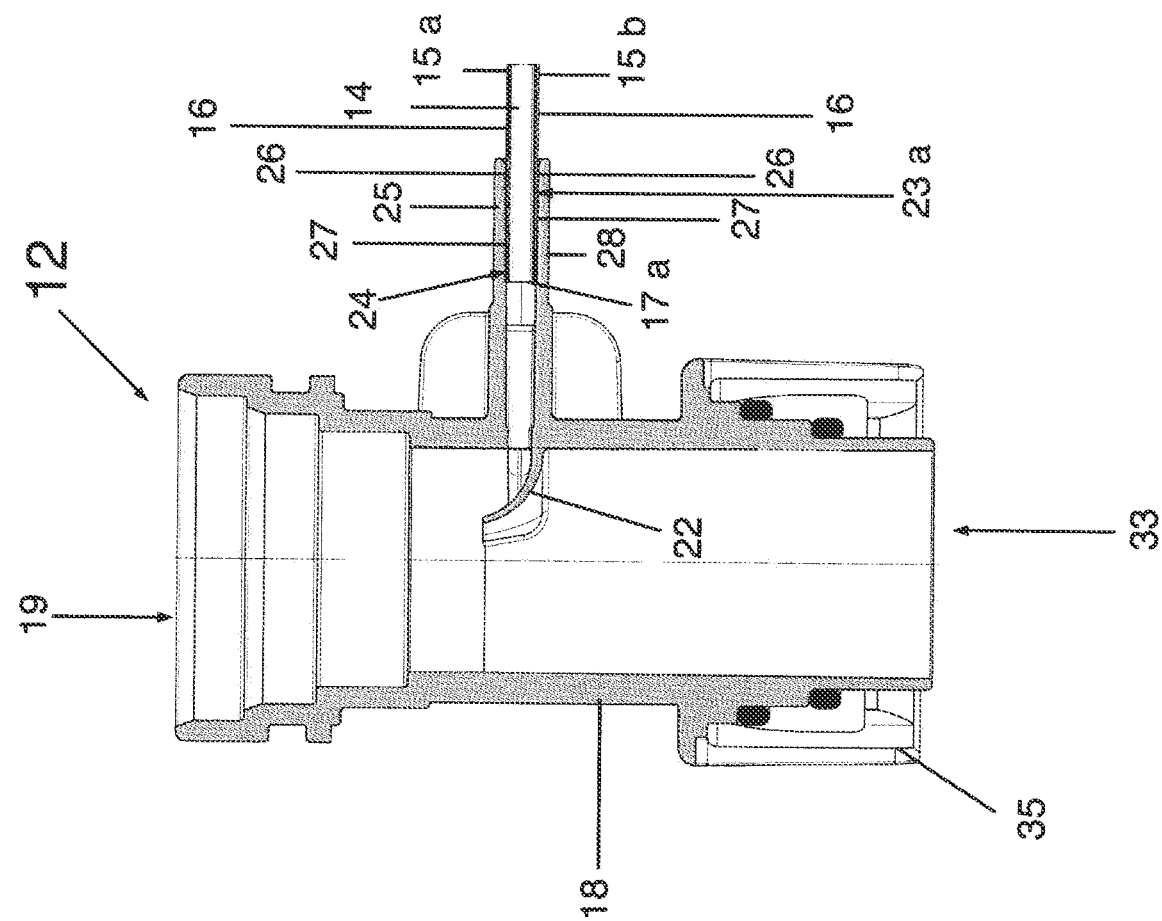

Further features of the present invention are revealed in the accompanying claims, in the description below of preferred exemplary embodiments and in the accompanying drawings, in which:

FIG. 1 shows an embodiment of a cooling component according to the invention, having a cooling body, a connection part (at one end of the cooling body) and a deflection cap (at the other end of the cooling body), in an angled view from below, FIG. 2 shows a view from below of the cooling component of FIG. 1, FIG. 3 shows a side view of the cooling component of FIG. 1, FIG. 4 shows a longitudinal section (horizontally) through the cooling component of FIG. 1, FIG. 5 shows a section through the connection part of the cooling component of FIG. 1, FIG. 6 shows a section through the deflection cap of FIG. 1.

The drawings show a cooling component 10, as is used, for example, when cooling battery or accumulator systems of electric vehicles in order to cool the respective batteries or the individual cells.

Such a cooling component 10 is generally part of a superordinate cooling device, which ensures that cooling medium is continuously conducted through the cooling component which cooling medium thereby absorbs, and then dissipates, waste heat of the object to be cooled. The components of the cooling device which are required for this, for instance a suitable pump, supply and discharge lines for the cooling medium etc., are known from the prior art and are therefore not explained in more detail.

In the present case, during use, the cooling component 10 may be connected to identical further cooling components (not shown) of the cooling device, which may then simultaneously cool a plurality of objects to be cooled, for example a plurality of batteries or battery cells.

The cooling component 10 has a cooling body 11 made of metal, in the present case of aluminum, which, during use, abuts against the object to be cooled or is at least arranged directly adjacent thereto.

The cooling body 11 has an elongated design, in the present case substantially as a (very) flat cuboid.

Relative to the main direction of extent of the cooling component 10 or of the cooling body 11, a connection part 12 is arranged at one end thereof, via which the cooling component 10 may be supplied with cooling medium, for instance cooling water or the like, which is conducted within a first group 14 a of elongated medium channels 14, then in the main direction of extent of the cooling body 11 or in the longitudinal direction to the other end of the cooling body 11, is then deflected in a deflection cap 13 arranged at the other end of the cooling component 10 or the cooling body 11 and flows in the opposite direction through a second group 14 b of elongated medium channels in the opposite direction through the cooling body 10 until it reaches the connection part 12 again and is conducted out of or discharged from the cooling component 10 via the connection part 12.

On its path through the cooling body 11 or the medium channels 14, the cooling medium, during operation of the cooling device or the cooling component 10, absorbs the waste heat of the object to be cooled, while cooling the object to be cooled, and transports it away.

The cooling body 11 is manufactured in one piece in the present case. It may be a profile body or a profile piece (pocket profile) which has been produced in an (aluminum) extrusion process.

In the present case, the cooling body 11 has four cooling body outer walls 15, namely a first large-surface, upper wall 15 a, a second large-surface, lower wall 15 b, opposite and parallel to the upper wall at a spacing, and two mutually parallel-extending narrow side walls 15 c and 15 d connecting the upper wall 15 a and the lower wall 15 b to one another in each case.

The (elongated) medium channels 14 are arranged in the interior of the cooling body 11, i.e. in the interior space enclosed by the body outer walls 15. The medium channels 14 extend parallel to the main direction of extent of the cooling body 11 here or parallel to the narrow side walls 15 c or 15 d. Relative to a cross section through the cooling body 11, the individual medium channels 14 are arranged adjacent to one another in a row.

Each (elongated) medium channel 14 is furthermore delimited at (all) of its longitudinal sides (relative to the main direction of extent of the respective medium channel 14) by medium channel walls 16. In the present case, this is realized specifically in each case by two pairs of medium channel walls 16 which are arranged opposite one another at a spacing in each case.

At two opposing longitudinal sides (which are vertical or extending perpendicularly to the upper and lower large-surface wall 15 a and 15 b), namely in the transverse direction or perpendicularly to the main direction of extent of the cooling body 11, each medium channel 14 is delimited by a first pair of two medium channel walls 16 in each case, arranged at a spacing from one another and extending parallel to each other in each case in the main direction of extent of the cooling body.

In the case of the two outer medium channels 14.1 and 14.2, one of these medium channel walls 16 of this first pair is formed in each case by the respective body outer wall 15 of the cooling body 11, in the present case the narrow side wall 15 or the narrow side wall 15 d.

Each (elongated) medium channel 14 is furthermore delimited at its other two longitudinal sides by a respective other pair of medium channel walls 16, in which the one medium channel wall 16 of the pair is formed by the upper large-surface wall 15 a and the other medium channel wall 16 of the pair is formed by the lower large-surface wall 15 b.

In the present case, each medium channel 14 is open at its two ends or transverse sides, namely at the transverse sides 17 a and 17 b. In other words, there is no wall there, so that cooling medium may flow into and out of the medium channel 14 through the transverse sides 17 a and 17 b.

With regard to the connection part 12, this has an inlet chamber 18 having an (upper) inlet opening 19, via which cooling medium can be supplied to the medium channels 14 of the first group 14*a* of medium channels 14. To this end, the open transverse sides 17 *a* of the medium channels 14 of the first group 14 *a* of medium channels 14 are arranged within the inlet chamber 18, so that the cooling medium may flow directly out of the inlet chamber 18 and into the medium channels 14 of this first group 14 *a* in/via the open transverse sides 17 *a*.

The connection part 12 furthermore has an outlet chamber 20 which is separate from the inlet chamber 18 and has an outlet opening 21, via which cooling medium can be discharged from the medium channels 14 of the second group 14 *b* of medium channels 14. To this end, the open transverse sides 17 *a* of the medium channels 14 of second group 14 *b* of medium channels are arranged within the outlet chamber 20, so that the cooling medium may flow directly out of the outlet chamber 18 and into the medium channels 14 of this second group 14 in/via the open transverse sides 17 *a*.

As can be seen in FIG. 5, for example, in the present case the main direction of extent of the medium channels 14 extends perpendicularity to the main direction of extent or main flow direction of the inlet chamber 18 and the outlet chamber 20 in each case.

To still enable the cooling medium supplied to the inlet chamber 18 via the inlet opening 19 to be efficiently guided into the medium channels 14, namely the first group 14 *a* of medium channels 14, a fluid-conducting wall 22 is arranged in the inlet chamber 18, which fluid-conducting wall, in the present case, is connected to the connection part 12 in one piece, extends at an angle to the main flow direction or main direction of extent of the inlet chamber 18, at least in some regions, (and, in particular, curves in the direction of the inlet opening 19, at least in some regions).

In the present case, starting from its end with which it is connected to the connection part 12 in one piece, this fluid-conducting wall projects into the inlet chamber 18 with a curvature in the direction of the inlet opening 19 and ensures that cooling medium meeting it (from above in FIG. 5) is deflected to the medium channels 14 of the first group 14 *a*.

In a wholly analogous manner (not shown), a corresponding fluid-conducting wall is also located in the outlet chamber 20 and there ensures that cooling medium which flows out of the medium channels 14 of the second group 14 *b* and into the outlet chamber 20 is deflected in the direction of the outlet opening 21.

In the present case, the inlet opening 19 is moreover located at one end of the inlet chamber 18 and a connection opening 33, to which a connection part of an identical further cooling component (not shown) can be connected, is located at another end, in particular to connect the inlet opening of the further cooling component to the connection opening 33.

The outlet opening 21 is analogously located at one end of the of the outlet chamber 20 and a connection opening 34 of the outlet chamber 20, to which a connection part of an identical further cooling component can be connected, is located at another end, in particular to connect the discharge opening 21 of the further cooling component to the connection opening 34.

The cooling component 10 or, in the present case, the connection part 12 furthermore has connecting means 35, in particular latching means, for releasably connecting the cooling component to an identical further cooling component. This is realized, in particular, in such a way that, after the connection, the connection opening 33 of the inlet chamber 18 is flush with the inlet opening of the inlet chamber of the further cooling component with a fluid-conducting connection between these openings, or in such a way that, after the connection, the connection opening 34 of the outlet chamber 20 is flush with the discharge opening of the outlet chamber of the further cooling component with a fluid-conducting connection between these openings.

It is now particularly important that—unlike the cooling body 11—both the connection part 12 and the deflection cap 13 are not made from metal (or possibly from a metal alloy) but from plastic. In the present case, these components are integrally formed in each case and produced as a plastic injection molded part, for instance from thermoplastic.

In a particular manner, the cooling body 11 on the one hand and the connection part 12 or the deflection cap 13 on the other are connected to one another in a fixed and fluid-tight manner in each case.

Therefore, to connect the connection part 12 to the cooling body 11, a first, terminal connecting region 23 *a* of the cooling body 11 is incorporated in a receiving space 24 of a (hollow cuboidal) receptacle 25 of the connection part 12 and is connected there to the inner side of the receptacle 25 in a fluid-tight manner, specifically to connecting faces 27 of the receptacle 25 which are arranged on the inner side, (which receiving space, in the present case, is substantially cuboidal and matches the first, substantially cuboidal connecting region 23 *a* of the cooling body 11).

The metallic cooling body (likewise) has connecting faces, namely connecting faces 26 in the first connecting region 23 *a*. Each of these (metallic) connecting faces 26 of the cooling body 11 has three-dimensional nanostructures and/or microstructures incorporated in the respective surface in each case by physical and/or chemical nanostructuring or microstructuring methods (for instance chemical etching or laser beam structuring).

In the present case, the connecting faces 26 of the cooling body 11 are specifically arranged on the outer sides of the body outer walls 15, and more precisely, as already mentioned, in the first connecting region 23 *a* in each case, i.e. in that end region or end portion of the cooling body 11 which is incorporated in the receiving space 24 of the receptacle 25 and which directly adjoins or abuts against walls 28 forming the receptacle 25, or the walls 28 which form or delimit the receiving space 24.

Each of the connecting faces 26 of the cooling body 11 which are structured in the manner described is opposite a respectively associated connecting face 27 of the receptacle 25 and connected thereto, more precisely pressed together with this (with direct thermal joining) as will be explained in more detail below.

In a similar manner, the deflection cap 13 is moreover also connected to the cooling body 11. To this end, the cooling body 11 has, at its other end, on which the deflection cap 13 is seated, a second connecting region 23 *b*, likewise with a plurality of connecting faces 26 and having three-dimensional nanostructures and/or microstructures incorporated in the respective surface in each case, in particular, by the said physical and/or chemical nanostructuring or microstructuring methods.

The deflection cap 13—similarly to the connection part 12—likewise has a receptacle 31 having a receiving space 30 in which the second connecting region 23 *b* of the cooling body 11 is incorporated, and—in an analogous manner to that described above for the connection between the cooling body 11 and the receptacle 25 of the connection part 12—is connected to the receptacle 31 of the deflection cap 13 there in a fluid-tight manner in that each connecting face 26 of the cooling body 11 is opposite a respectively associated connecting face of the receptacle 31 and is pressed together with this in the manner described.

As indicated above, the medium channels 14 moreover also have open transverse sides 17 b in the region of the other end of the cooling body 11, wherein these open transverse sides 17 b are arranged in a deflection space 36 of the deflection cap 13. The deflection cap 13 here is designed in such a way that cooling medium which flows out of the open transverse sides 17 b—arranged in this region of the other end—of the first group 14 a of medium channels 14 and into the deflection space 36 is deflected in the deflection space 36 to the open sides 17 b of the medium channels 14 of the second group 14 b of medium channels 14, enters these medium channels and then—in the second group 14 b of medium channels—flows back through the cooling body 11 to the connection part 12 in the opposite direction.

The specific production of the cooling component 10 and, in particular, the above-mentioned connection of the metallic cooling component 10 to the connection part 12 made from plastic and to the deflection cap 13 made from plastic takes place here in a particular manner.

Firstly, the cooling body 11, the connection part 12 and the deflection cap 13 are prefabricated separately.

The above-mentioned components 11, 12, 13 are then connected to one another. This is described below using the connection of the connection part 12 to the cooling body 11 as an example. The connection of the cooling body 11 to the deflection cap 13 takes place in an analogous manner.

To connect the cooling body 11 and the connection part 12, these two components are firstly moved relative to one another, By way of example, by holding the connection part 12 stationary and moving the cooling body 11 in the direction of the connection part 12 by means of a suitable conveyor member. It goes without saying that the procedure may also take place the other way round or both components may be moved towards one another.

Within the context of the above-mentioned relative movement, the cooling body 11 is then moved relative to the connection part 12 in such a way that, during this, the first connecting region 23 a of the cooling body is placed in the receptacle 25 or the receiving space 24 in a precisely fitting manner such that each of the connecting faces 26 of the first connecting region 23 a of the cooling body 11 is opposite a respectively associated connecting face 27 of the receptacle 25 of the connection part 12.

After, during and/or before this, the metallic cooling body 11, or at least the connecting faces 26 of the first connecting region 23 a of the cooling body 11 are then heated to a temperature corresponding at least to the softening temperature or the melting temperature of the plastic of the connection part 12 or of the receptacle 25 of the connection part 12, in particular by means of induction heating known from the prior art (other heating techniques are, of course, also conceivable).

The heat of the cooling body 11 is then transferred to the connection part 12 or the connecting faces 27 thereof when the first connecting region 23 a of the cooling body 11 is located in its intended end position in the receptacle 25, which then results in fusion of the connecting faces 27.

By way of example, by means of one or possibly a respective pressing member, for instance pressing jaws (not shown), which each press externally on the walls 28 of the receptacle 25 which are to be connected, the respective connecting face 27 of the receptacle 25—arranged on the inner side of the respective wall 28 of the receptacle 25—is pressed against the respective (structured) connecting face 26 of the cooling body 11 directly before and/or directly after the fusion process, and is therefore connected thereto in a fluid-tight manner (direct thermal joining).

For one or more of the faces to be connected, provision may moreover also be made for a respective pair of connecting faces 26 of the cooling body 11, which are opposite one another at a spacing, to be connected to the corresponding opposite walls via an alternative press fit.

By way of example, the connecting faces 26 of the narrow side walls 15 c, 15 d or the connecting faces 26 arranged on the narrow side walls 15 c, 15 d might be pressed together with the respectively opposing connecting faces 27 of the walls 28 of the receptacle 25 of the connection part 12 in that, prior to the connection, the mutual spacing of the connecting faces 26 of the narrow side walls 15 c, 15 d is matched to the spacing of the opposing connecting faces 27 of the connection part 12 such that the connecting faces 26, when they are subsequently already in the correct position or in their respective end position in the receiving space 24 of the connection part 12, undergo thermal expansion as a result of the heating of the connecting faces 26 of the cooling body 11 (which only takes place in this position), so that they are thus pressed against the respectively opposing connecting face 27 of the receptacle 25 or the wall 28 of the receptacle 25 (i.e. without an external pressing member) and thereby heat or fuse the connecting faces 27 of the receptacle 25 so that (after subsequent cooling) a corresponding press fit is produced.

By way of example, provision may also be made for only those connecting faces 27 of the receptacle 25 which are opposite the first large-surface wall 15 a or the second large-surface wall 15 b of the cooling body 11 in each case to be pressed together with opposing connecting face 26 of the cooling body 11 by a respective pressing member, and for the other connecting faces 27 of the receptacle 25 which are opposite the connecting face 26 of the respective narrow side wall 15 c or 15 d of the cooling body 11 in each case to be connected to the respective connecting face 26 of the cooling body 11 via the above press fit.

LIST OF REFERENCE SIGNS

10 Cooling component
11 Cooling body
12 Connection part
13 Deflection cap
14 Medium channel
14.1 Outer medium channel
14.2 Outer medium channel
14 a First group of medium channels
14 b Second group of medium channels
15 Body outer walls
15 a First large-surface wall
15 b Second large-surface wall
15 c Narrow side wall
15 d Narrow side wall
16 Medium channel wall
17 a Open transverse side
17 b Open transverse side
18 Inlet chamber
19 Inlet opening
20 Outlet chamber
21 Outlet opening
22 Fluid-conducting wall
23 a First connecting region, cooling body
23 b Second connecting region, cooling body
24 Receiving space, connection part
25 Receptacle, connection part
26 Connecting faces, cooling body
27 Connecting faces, receptacle, connection part
28 Walls, receptacle
30 Receiving space, deflection cap
31 Receptacle, deflection cap
32 Connecting faces, receptacle, deflection cap
33 Connection opening, inlet chamber
34 Connection opening, outlet chamber
35 Connecting means
36 Deflection space, deflection cap

The invention claimed is:

1. A method for producing a cooling component, which has a cooling body made of metal or a metal alloy, aluminum, with which an object may be cooled, wherein the cooling body has one or more, parallel medium channels for the throughflow of cooling medium, and a connection part, which is connected to the cooling body in a fluid-tight manner and via which the cooling medium can be supplied to the cooling body and/or via which the cooling medium can be discharged from the cooling body, having the following measures:
   a) inserting an, terminal connecting region of a/the prefabricated cooling body, which is, produced by profile extrusion and, manufactured in one piece, into a receiving space of a receptacle of a/the prefabricated, injection molded, plastic connection part for the cooling body via a relative movement between the cooling body and the connection part, so that each of a plurality of, mutually parallel opposing connecting faces of a connecting region of the cooling body, each with three-dimensional nanostructures and/or microstructures incorporated, by physical and/or chemical nanostructuring or microstructuring methods, is opposite a respectively associated connecting face of the receptacle of the connection part, a respectively associated connecting face which is arranged on an inner side of a wall of the receptacle,
   b) heating the connecting faces of the cooling body, via induction, to a temperature which corresponds at least to a softening temperature or melting temperature of the plastic of the connection part, before the connecting region of the cooling body is inserted into the receiving space of the receptacle and/or while the connecting region is located in the receiving space,
   c) connecting all heated connecting faces of the cooling body to the respectively opposing connecting face of the connection part in a fluid-tight manner by pressing these mutually opposing connecting faces together with fusion of the connecting face of the connection part through the heat of the connecting face of the cooling body.

2. The method as claimed in claim 1, wherein all connecting faces of the cooling body, or only a pair of connecting faces of the cooling body, which are, opposite one another at a spacing, is/are pressed together with the respectively opposing connecting face of the connection part in that a pressing member presses the respective connecting face of the connection part against the respectively opposing connecting face of the cooling body in each case.

3. The method as claimed in claim 1, wherein all connecting faces of the cooling body or only a pair of, opposing connecting faces of the cooling body is/are pressed together with the respectively opposing connecting face of the connection part in that the spacing of mutually opposing connecting faces of the cooling body is matched to a spacing of mutually opposing connecting faces of the connection part so that, by heating these connecting faces of the cooling body in an inserted state of the connecting region of the cooling body in the receiving space of the connection part, a thermal expansion of the cooling body material results in a press fit, in the course of which the respective connecting face of the cooling body is pressed against the respectively opposing connecting face of the connection part.

4. The method as claimed in claim 2, wherein the cooling body is a profile body having a first large-surface wall, a second large-surface wall, which is spaced therefrom and extends, parallel thereto, and two mutually spaced narrow side walls connecting the first and the second large-surface wall to one another, wherein the connecting faces of the cooling body are (terminal) regions of outer sides of these profile body walls.

5. The method as claimed in claim 4, wherein those connecting faces of the connection part which are opposite the first large-surface wall or the second large-surface wall in each case are pressed against the respectively opposing connecting face of the cooling body by a respective pressing member, and/or those connecting faces of the connection part which are opposite a connecting face of one of the narrow side walls of the cooling body in each case are connected to the respective connecting face of the cooling body via the press fit.

6. The method as claimed in claim 5, wherein the connecting faces of all of these walls of the cooling body are connected to the respectively opposing connecting face of the connection part by a respective pressing member pressing the connecting face of the connection part against the respective wall.

7. The method as claimed in claim 1, wherein the pressing of the respective connecting face of the connection part against the respectively opposing connecting face of the cooling body takes place by means of the respective pressing member in that this applies pressure to the wall of the receptacle on which the respective connecting face is arranged, to the outer side of this wall.

\* \* \* \* \*